United States Patent
Chen

(10) Patent No.: US 7,863,616 B2
(45) Date of Patent: Jan. 4, 2011

(54) STRUCTURE OF THIN FILM TRANSISTOR ARRAY

(75) Inventor: Yu-Cheng Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 109 days.

(21) Appl. No.: 12/333,313

(22) Filed: Dec. 12, 2008

(65) Prior Publication Data

US 2009/0090912 A1    Apr. 9, 2009

Related U.S. Application Data

(62) Division of application No. 11/309,009, filed on Jun. 8, 2006, now Pat. No. 7,537,973.

(30) Foreign Application Priority Data

Jan. 12, 2006    (TW) ............................... 95101181 A

(51) Int. Cl.
*H01L 29/04* (2006.01)
*H01L 31/036* (2006.01)
*H01L 31/0376* (2006.01)
*H01L 31/20* (2006.01)
*H01L 31/062* (2006.01)

(52) U.S. Cl. ................... 257/59; 257/72; 257/347; 257/292

(58) Field of Classification Search .............. 257/223, 257/291, 292, 443, 655, 57, 59, 72, 347, 257/350, 351, 439
See application file for complete search history.

(56) References Cited

U.S. PATENT DOCUMENTS 7,323,714 B2 *   1/2008   Kato et al. ................. 257/59
2002/0019082 A1   2/2002   Wong

FOREIGN PATENT DOCUMENTS

| CN | 01133182 | * | 3/2003 |
|----|----------|---|--------|
| CN | 1405865  |   | 3/2003 |
| CN | 1355561  |   | 6/2006 |

* cited by examiner

*Primary Examiner*—Chuong A. Luu
(74) *Attorney, Agent, or Firm*—Jianq Chyun IP Office

(57) ABSTRACT

A substrate having a gate electrode layer, a gate insulating layer, and a silicon layer thereon is provided. These layers are patterned into a gate area, a gate line and a gate line wiring area. A passivation layer is formed on the entire substrate and patterned to form two contact holes in the passivation layer on the silicon layer at the gate area, and partions of the passivation layer at the gate line and at the gate line wiring areas are removed. An ion implanting layer and a metal layer are formed on the substrate and patterned to form a source region, a drain region, a data line, a data line wiring area and a second layer of the gate line wiring area. A pixel electrode is formed on the passivation layer and electrically coupled to the drain region. Therefore, the TFT array can be fabricated by only four masks.

8 Claims, 17 Drawing Sheets

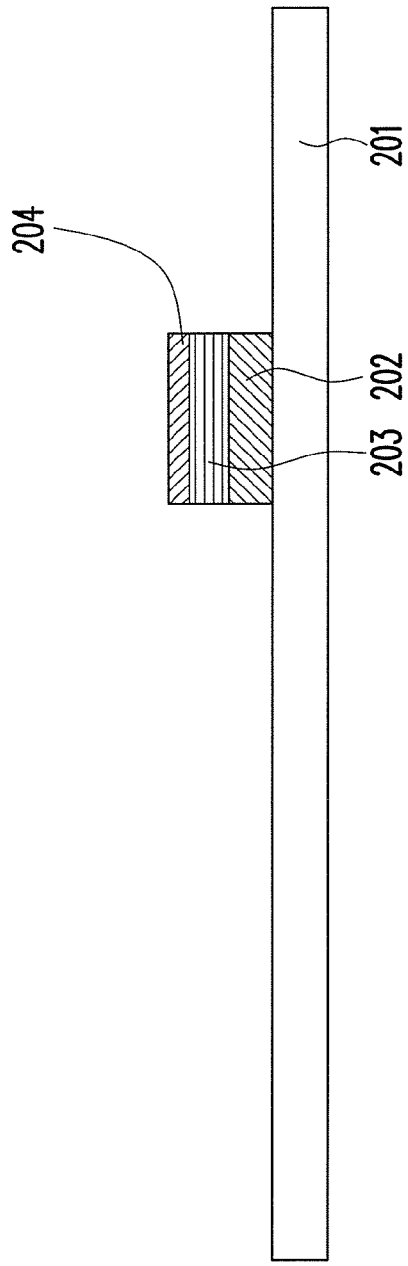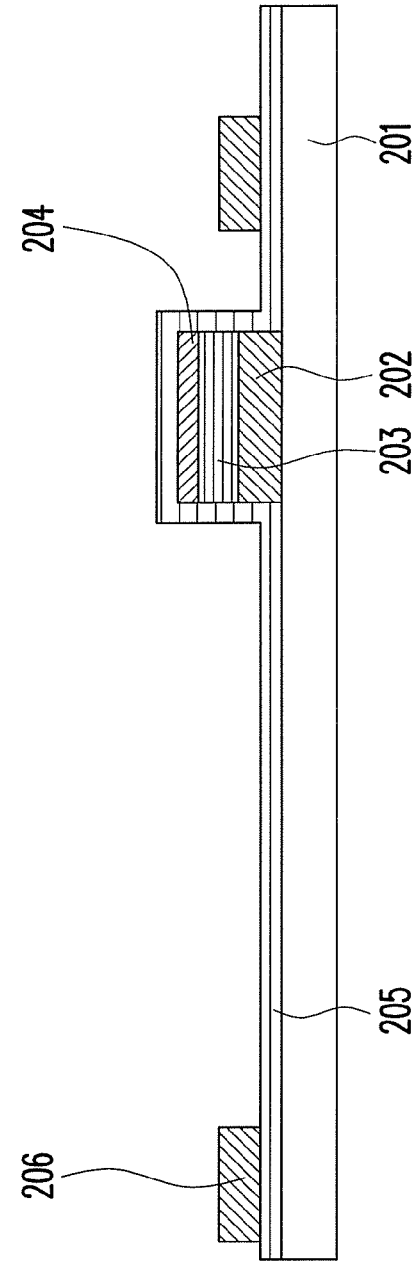
FIG. 2A (PRIOR ART)
FIG. 2B (PRIOR ART)

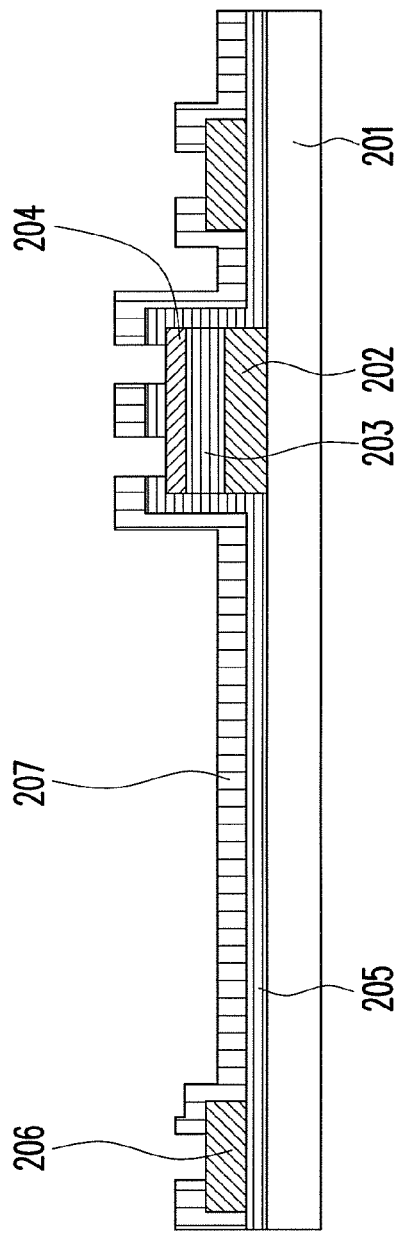
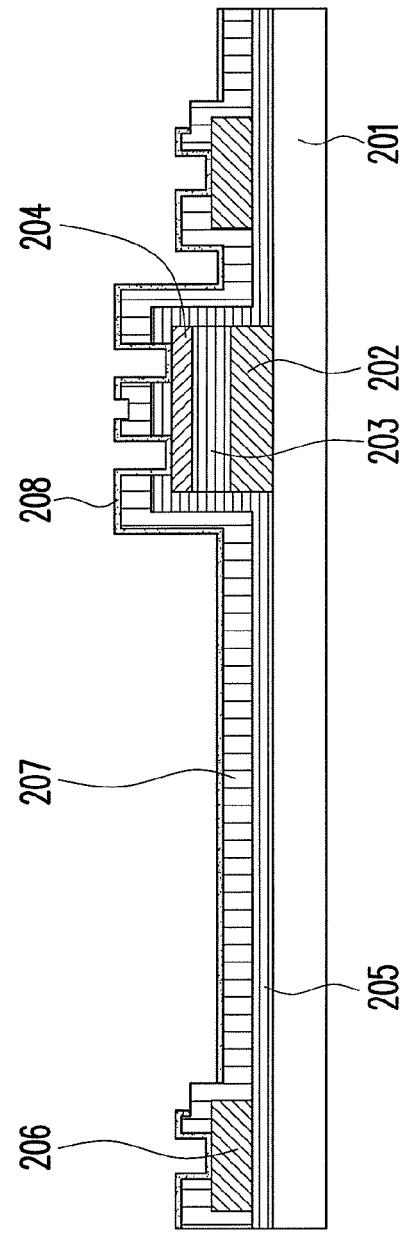
FIG. 2C (PRIOR ART)
FIG. 2D (PRIOR ART)

STRUCTURE OF THIN FILM TRANSISTOR ARRAY

CROSS-REFERENCE TO RELATED APPLICATION

This application is a divisional of an application Ser. No. 11/309,009, filed on Jun. 8, 2006 now U.S. Pat. No. 7,537,973, which claims the priority benefit of Taiwan application serial no. 95101181, filed on Jan. 12, 2006. The entirety of each of the above-mentioned patent applications is hereby incorporated by reference herein and made a part of this specification.

BACKGROUND OF THE INVENTION

1. Field of the Invention

The present invention relates to a structure of a thin film transistor (TFT) array and a method for fabricating the same. More particularly, the present invention relates to a structure of a TFT array and a method for fabricating the same by using four masks.

2. Description of Related Art

As going with the development of the flat panel display, the cost of thin film transistor liquid crystal displays (TFT LCDs) has been continuously reduced and the market share of TFT LCD has continuously increased. Therefore, how to reduce the fabrication cost is the most concerned issue for manufacturers. The fabrication of the current TFT array of a TFT LCD requires five masking processes, i.e., five photolithography processes. Each masking process includes steps of coating the photoresist, exposing and developing the exposed photoresist and removing the photoresist. Therefore, if one of the photolithography processes can be saved, the fabricating cost can be greatly reduced and the throughput can be significantly increased. Moreover, the larger the panel substrate is, the more expensive the mask will be. Therefore, saving one mask can significantly reduce the fabrication cost.

FIG. 1 shows a cross-sectional view of the existing TFT array fabricated by using five masks. First, a metal layer is formed on the substrate 100 and then patterned using the first mask to form a gate electrode 102 and a storage capacitance electrode 104. Then, a gate insulating layer (silicon nitride) 106, an amorphous silicon layer 108, and an $N^+$ implanting layer 110 are deposited on the substrate 100. The second mask is then used to pattern the amorphous silicon layer 108 and the $N^+$ implanting layer 110. The deposition of an ITO (indium tin oxide) transparent electrode is performed and an ITO transparent electrode 114 as shown in FIG. 1 is defined by the third mask. A source/drain pattern 112 is defined by the fourth mask. A passivation layer is subsequently deposited, and the passivation layer 116 is defined by the fifth mask. Accordingly, for fabricating the conventional TFT structure, five masks are inevitably required, which would increase the fabrication cost.

Several methods have been proposed to reduce the number of masks, among which a half tone or gray tone mask is used to replace two aforementioned masks. After the half tone exposure and development, a gate area is etched, and then a source/drain region is etched. However, the half tone or gray tone mask is very expensive. Though the number of masks may be reduced, an additional a photoresist etching process is required. In this way, the fabricating cost cannot be significantly reduced. Moreover, it is hard to control the pattern when a half tone or gray tone mask is employed, causing dimension error and other problems. Thus, the fabrication yield is lowered.

FIGS. 2A to 2D are cross-sectional views of another process for fabricating a TFT array using four masks disclosed by U.S. Pat. No. 6,891,196. As shown in FIG. 2A, a metal layer, an insulating layer and a silicon layer are formed on the substrate 201. An island region having a gate electrode 202, a gate insulating layer 203 and a silicon layer 204 is then defined by a mask. Next, a passivation layer 205 is formed and a source/drain 206 is defined. A passivation layer 207 is formed, and the passivation layers 205, 207 are patterned using a mask. Next, an ITO electrode layer 208 is formed, and then patterned using a mask. According to this method, a portion of the ITO layer 208 is used as an ordinary pixel electrode, and another portion thereof is used as a contact electrode of the source/drain. However, the method employs a special process to perform amorphous silicon implantation, i.e., using high-temperature plasma to diffuse phosphor, so as to form an $N^+$ implanting layer. Therefore, though the number of masks is reduced, a special process is required to form the $N^+$ implanting layer and the TFT structure also becomes complicated.

As a result, how to reduce the total number of masks and how to use an ordinary process to reduce the cost have become an important issue to the manufacturers in the field.

SUMMARY OF THE INVENTION

According to the above description, the present invention is directed to a structure of a TFT array and a method for fabricating the same. The fabricating cost can be reduced and the process can be simplified.

The present invention is further directed to a structure of a TFT array and a method for fabricating the same. The TFT array can be fabricated via a simple and flexible process.

In light of the foregoing, the present invention provides a method for fabricating the TFT array. The method includes the following steps. A substrate having a gate electrode layer, a gate insulating layer and a silicon layer formed thereon is provided. The gate electrode layer, the gate insulating layer and the silicon layer are patterned to define a gate area, a gate line, and a gate line wiring area. A passivation layer is formed over the entire substrate and patterned to form at least two contact holes in the passivation layer over the silicon layer at the gate area and to partially remove portions of the passivation layer at the gate line and at the gate line wiring area. An ion implanting layer and a metal layer are formed on the entire substrate and patterned to form a source region, a drain region, a data line, a data line wiring area, and a second layer of the gate line wiring area. A pixel electrode is formed on the passivation layer and is electrically coupled to the drain region.

According to an embodiment of the invention, the foregoing fabricating method further includes an etching step for etching the exposed silicon layer. In addition, the aforementioned gate line wiring area is formed by stacking a gate electrode layer, a gate insulating layer, a silicon layer, an ion implanting layer, and a metal layer. The gate insulating layer is, for example, a silicon nitride layer or a silicon oxide layer. When the silicon layer is a poly-silicon layer, the ion implanting layer is a P-type or N-type implanting layer. When the silicon layer is an amorphous silicon layer, the ion implanting layer is generally an N-type implanting layer. The aforementioned pixel electrode can be, for example, a transparent electrode or a metal electrode.

Moreover, the invention further provides a method for fabricating a TFT array. The method includes the following steps. A substrate having a gate electrode layer, a gate insulating layer, and a silicon layer formed thereon is provided.

The gate electrode layer, the gate insulating layer, and the silicon layer are patterned to define a gate area, a gate line, and a gate line wiring area. A passivation layer is formed over the entire substrate and a photoresist layer is formed on the passivation layer. Then, the passivation layer and the photoresist layer are patterned to form at least two contact holes in the passivation layer and the photoresist on the silicon layer at the gate area. Partial portions of the passivation layer above the gate line, and the passivation layer and the photoresist at the gate line wiring area are removed. An ion implanting process is performed on the exposed silicon layer to form a source and a drain in the exposed silicon layer. A metal layer is formed over the entire substrate and patterned to form a source metal layer, a drain metal layer, a date line, a data line wiring area and a second layer of the gate line wiring area. A pixel electrode is formed on the passivation layer and is electrically coupled to the metal layer connected to the drain.

According to an embodiment of the invention, the foregoing fabricating method further includes an etching step for etching the exposed silicon layer. In addition, the aforementioned gate line wiring area is formed by stacking a gate electrode layer, a gate insulating layer, a silicon layer and a metal layer. The gate insulating layer is, for example, a silicon nitride layer or a silicon oxide layer. When the silicon layer is a poly-silicon layer, the ion implanting process is to perform a P-type or N-type ion implantation. When the silicon layer is an amorphous silicon layer, the ion implanting process is generally to perform an N-type implantation. The aforementioned pixel electrode is a transparent electrode or a metal electrode.

The present invention also provides a structure of a TFT array. The structure includes a substrate divided into a gate line wiring area and a gate area; a stacked structure disposed on the gate area of the substrate and the gate line wiring area, in which the stacked structure comprises a gate electrode layer, a gate insulating layer and a silicon layer; a passivation layer covering the substrate and exposing the stacked structure of the gate line wiring area, in which the passivation layer disposed on the stacked structure of the gate area further includes at least two contact holes for exposing the silicon layer; an ion implanting layer, covering the passivation layer and the stacked structure corresponding to the gate area and covering the stacked structure of the gate line wiring area, in which the ion implanting layer is further connected to the silicon layer; a metal layer, covering the ion implanting layer, in which the metal layer disposed at the gate line wiring area is used as a second layer of the gate line wiring area, while the metal layer disposed at the gate area is respectively used as a source and a drain; and a pixel electrode layer, covering the passivation layer for connecting the metal layer and the ion implanting layer both serving as a drain.

According to an embodiment of the present invention, when the silicon layer is a poly-silicon layer, the ion implanting layer is P-type or N-type ion implanting layer. When the silicon layer is an amorphous silicon layer, the ion implanting layer is usually an N-type ion implanting layer. Moreover, the foregoing pixel electrode can be a transparent electrode or a metal electrode.

The present invention also provides a TFT array structure. The structure includes a substrate divided into a gate line wiring area and a gate area; a stacked structure disposed on the gate area and a gate line wiring area of the substrate, in which the stacked structure is constituted by a gate electrode layer, a gate insulating layer, and a silicon layer; a passivation layer, covering the substrate and exposing the stacked structure of the gate line wiring area, in which the passivation layer disposed on the stacked structure of the gate area further has at least two contact holes for exposing the silicon layer, and an ion implantation is further performed on the exposed silicon layer; a metal layer, covering the exposed silicon layer, in which the metal layer disposed at the gate line wiring area is used as a second layer of the gate line wiring area, while the metal layer disposed at the gate area is respectively used as a source and a drain; and a pixel electrode layer, covering the passivation layer and connected to the metal layer used as a drain.

According to an embodiment of the present invention, when the silicon layer is a poly-silicon layer, the silicon layer is subject to a P-type or N-type ion implantation. When the silicon layer is an amorphous silicon layer, the silicon layer is usually subject to an N-type ion implantation. Moreover, the pixel electrode can be a transparent electrode or a metal electrode.

In summary, the present invention provides a new method for arranging the TFT array structure. The gate electrode layer, the gate insulating layer, and the silicon layer can be patterned simultaneously by using one mask, so as to define a gate area, a gate line, and a gate line wiring area. In addition, the data line, the drain metal layer, and the source metal layer are formed above the passivation layer, and therefore, the total number of masks can be reduced to four. Moreover, a simple ion implantation instead of a special high-temperature plasma diffusing process is employed to implant ions into the silicon layer. Thus, the fabrication cost can be effectively reduced. Furthermore, the fabrication processes can be flexibly altered, having more freedom.

In order to the make aforementioned and other features, and advantages of the present invention comprehensible, embodiments accompanied with figures are described in detail below.

BRIEF DESCRIPTION OF THE DRAWINGS

FIGS. 2A to 2D show sectional views of a conventional process for fabricating a TFT array using four masks.

DESCRIPTION OF EMBODIMENTS

The concept of the present invention mainly employs four masks to simplify the method for fabricating the TFT array in order to reduce the fabrication cost. Moreover, the four-mask process accompanied with the modification of the structure can further simplify the process and reduce the cost. Embodiments are described as examples below to illustrate the concept of the present invention.

The First Embodiment

Figure 1:
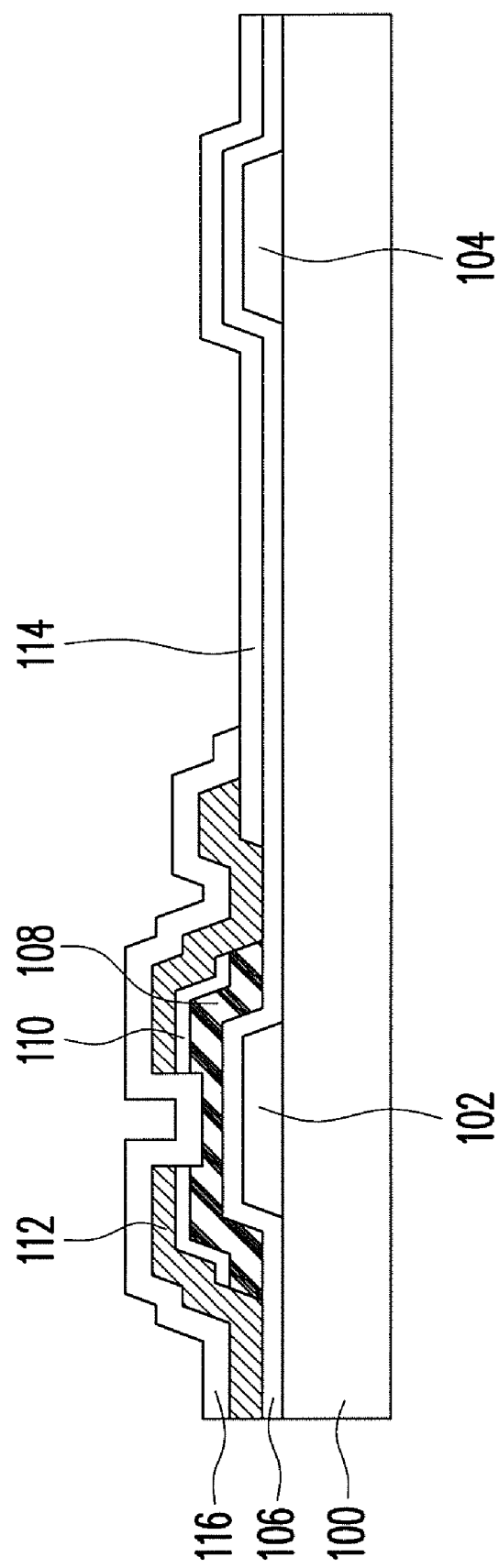
FIG. 1 shows a cross-sectional view of a conventional TFT array fabricated using five masks.
Figure 3:
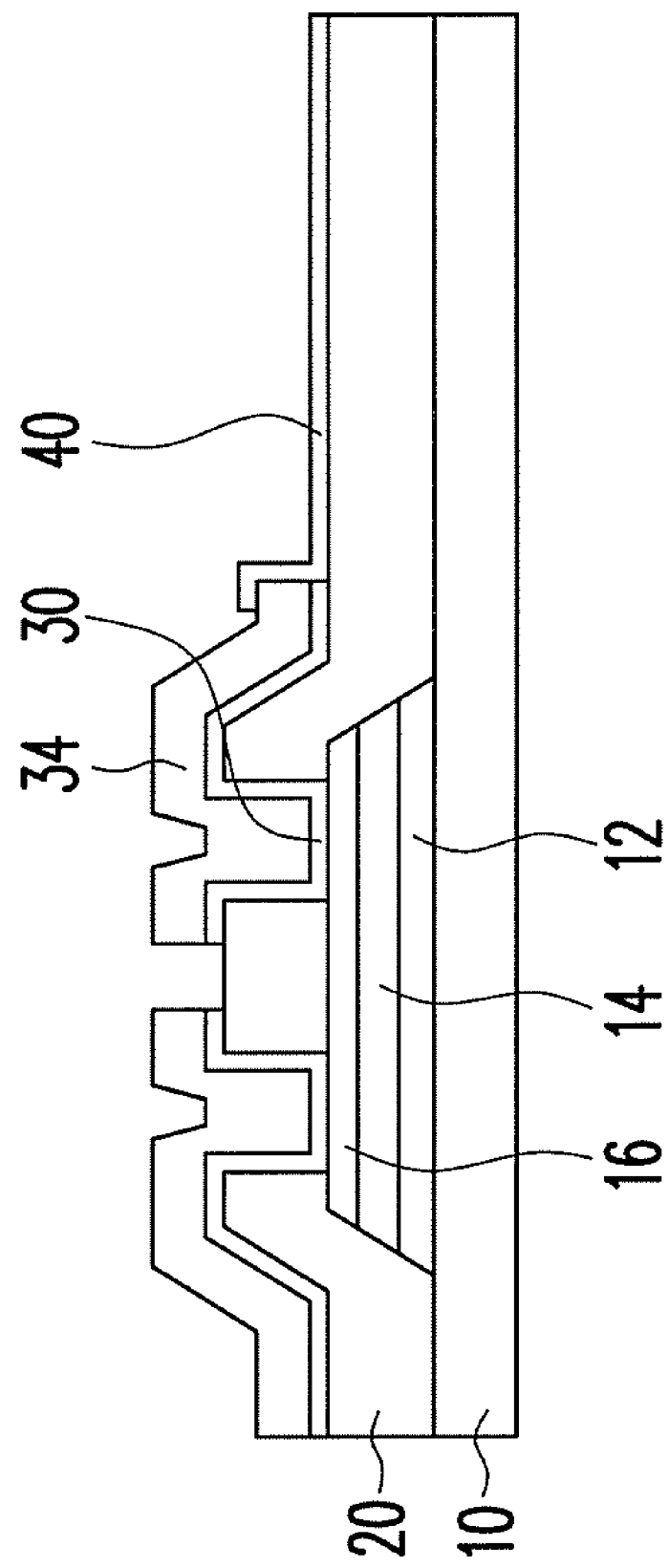
FIG. 3 is a sectional view of the TFT array fabricated using the fabricating method according to the first embodiment of the invention.
Figure 4A:
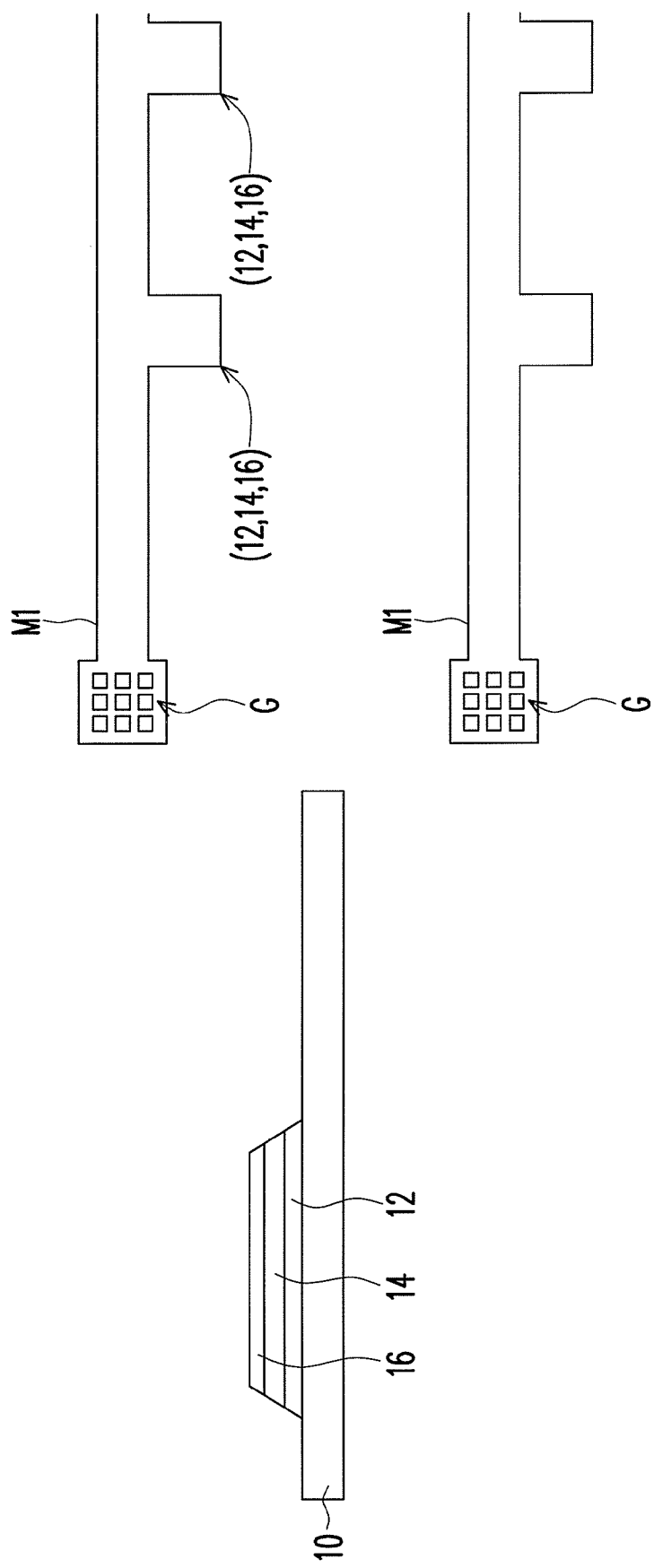
FIGS. 4A to 4D are schematic views illustrating the process steps of fabricating a TFT array according to the first embodiment, in which the cross-sectional views shown on the left of each figure indicate the fabrication step, and the schematic views on the right show the array layout employed in the fabrication method.
Figure 4B:
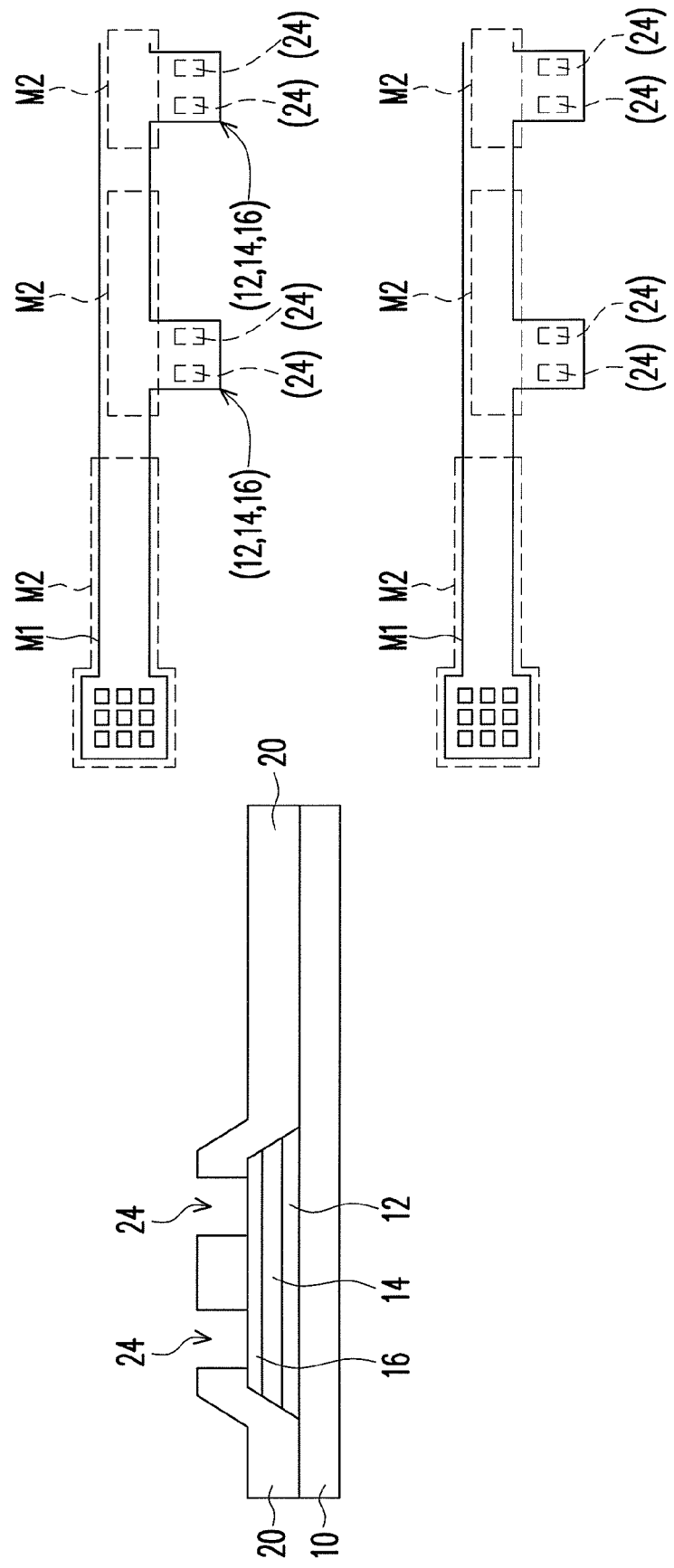
Figure 4C:
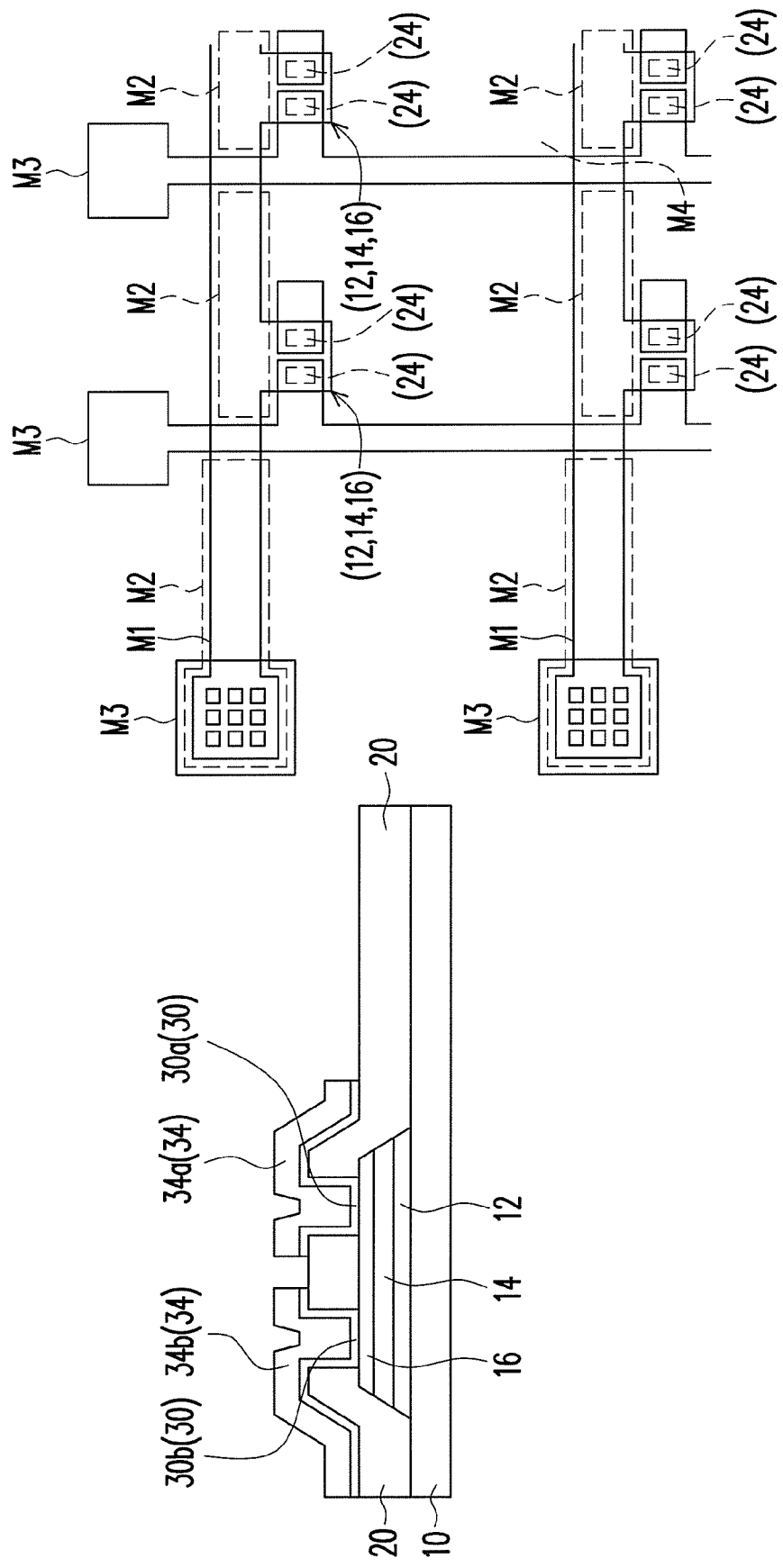
Figure 4D:
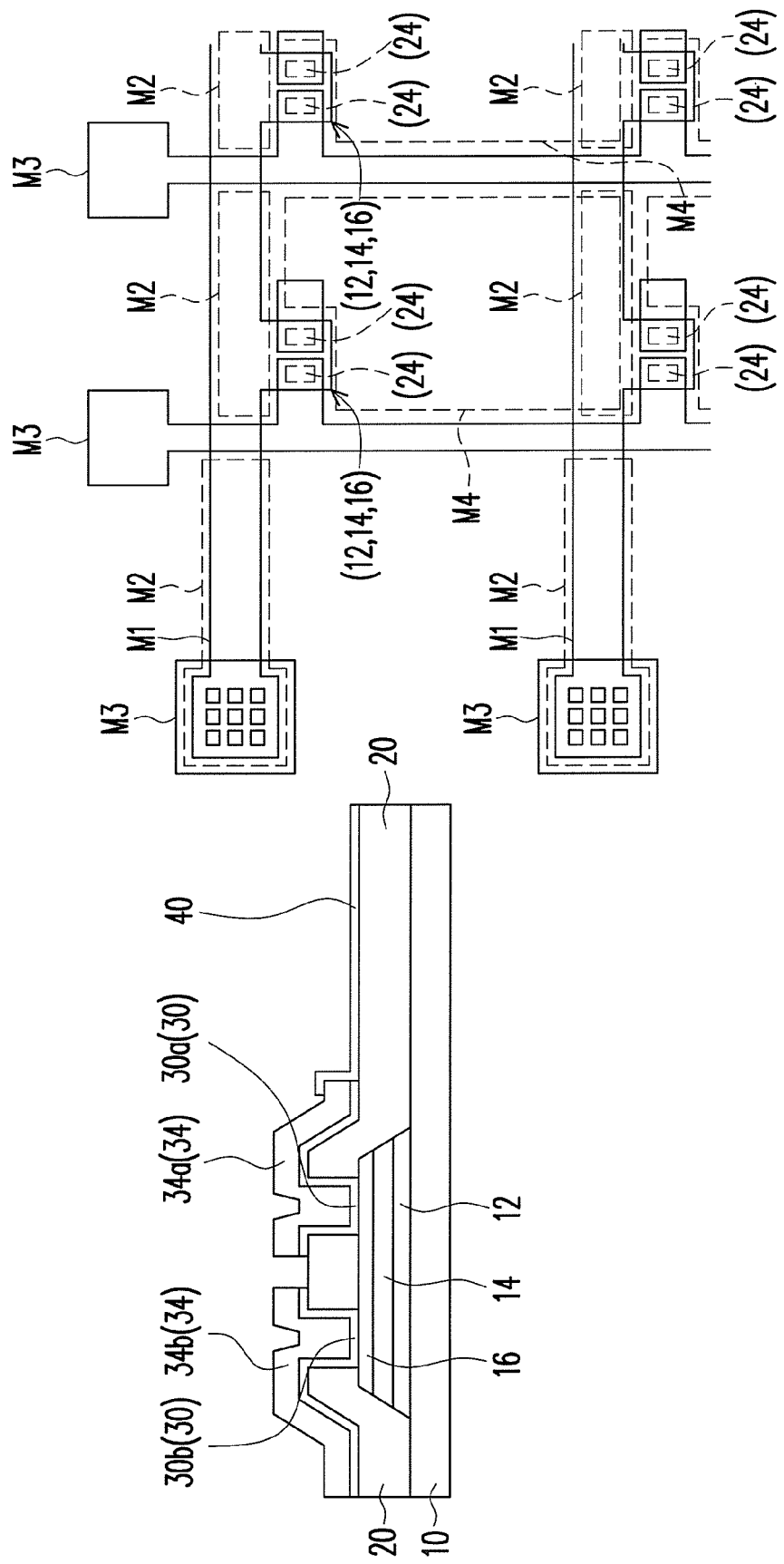
Figure 5:
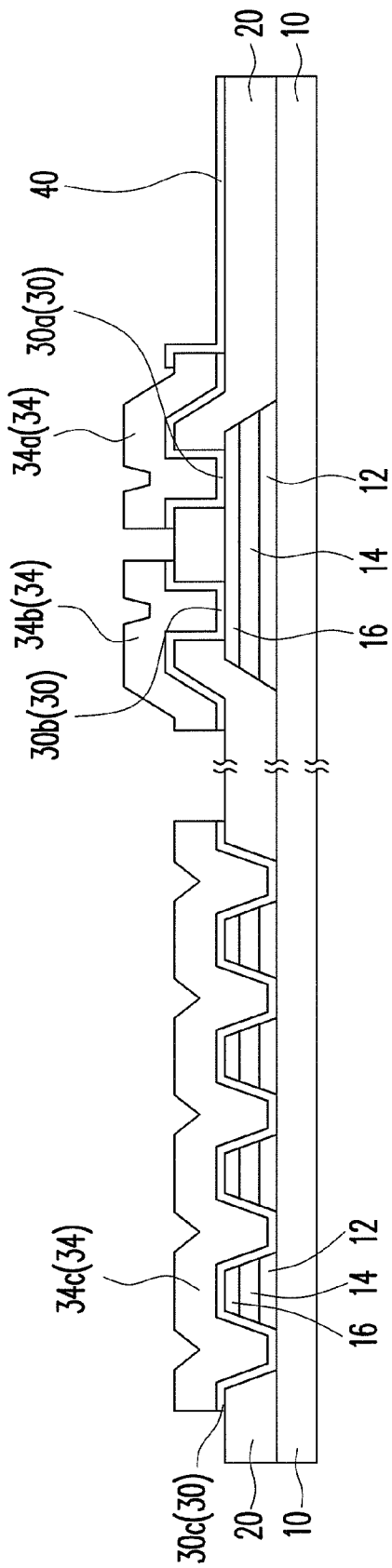
FIG. 5 is a schematic cross-sectional view of the gate line wiring area of the TFT array in FIG. 3.

FIG. 3, FIGS. 4A to 4D, and FIG. 5 illustrate the first embodiment of the present invention. FIG. 3 is a cross-sectional view of the TFT fabricated using the fabricating method according to the first embodiment. FIGS. 4A to 4D are schematic views illustrating the process steps of fabricating method a TFT array according to the first embodiment of the present invention, in which the cross-sectional views shown at the left of each figure indicate the fabrication step, while the schematic views shown at the right side of each figure indicate the design of the display array. The left part of FIG. 5 is the schematic cross-sectional view of the gate pad or the gate line wiring area of the TFT in FIG. 3.

First, referring to FIG. 4A, a gate electrode layer 12, a gate insulating layer 14 and a silicon layer 16 are formed over the substrate 10. The substrate 10 can be any applicable substrate such as a glass substrate, a plastic substrate, a flexible substrate, a silicon substrate or a metal substrate. A conductive material such as metal or poly-silicon can be used to form the gate electrode layer 12. Any suitable insulating material, such as silicon nitride or silicon oxide, can be used to form the gate insulating layer 14. The silicon layer 16 can be made of amorphous silicon, poly-silicon, or the like, for example. Next, a mask M1 is used to pattern the gate electrode layer 12, the gate insulating layer 14 and the silicon layer 16 to form a structure shown at the left side of FIG. 4A, which is substantially a stacked structure. The first mask M1 of the present invention is mainly used to define gate areas (12, 14, 16), a gate line and a gate line wiring area G.

Referring to FIG. 4B, a passivation layer 20 is formed on the whole substrate 10. The passivation layer 20 can be formed by any suitable method, such as a deposition or a coating process. Next, a second mask M2 is employed to pattern the passivation layer 20, including steps of such as coating a photoresist, exposing the photoresist, developing the photoresist and removing the photoresist. In this way, contact holes 24 are formed in the passivation layer 20, and a portion of the passivation layer above the gate line and the passivation layer above the gate line wiring area G are removed. The contact holes 24 expose the silicon layer 16 underneath.

Next, the use of the third mask according to the present invention is illustrated. As shown in FIG. 4C, the foregoing contact holes are formed and a portion of the passivation layer above the gate line and the passivation layer of the gate line wiring area G are removed. Next, an ion implanting layer 30, for example, an $N^+$ ion implanting layer, is formed over the entire passivation layer 20. Moreover, when the above silicon layer 16 is a poly-silicon layer, the ion implanting layer 30 is a P-type or N-type ion implanting layer. When the above silicon layer 16 is an amorphous silicon layer, the ion implanting layer 30 is usually an N-type ion implanting layer.

A metal layer 34 is formed on the ion implanting layer 30. Then, the metal layer 34 is patterned by using the third mask M3. The mask M3 is mainly used to define a data line, a data line wiring area, a source/drain region, and a second layer of the gate line wiring area.

After patterning with the mask M3 is performed, for example, photoresist coating, exposing, developing, and etching, the source regions (30b, 34b) and drain regions (30a, 34a) as shown at the left of FIG. 4C are defined. The left part of the metal layer 34b as shown on the left of FIG. 4C is used as a data line of the TFT array, and is electrically connected to the source 30b of the TFT.

In the foregoing etching process, a portion of the silicon layer 16 underneath is exposed. At this time, a step of removing the exposed silicon layer can be performed according to requirements. The step is not a necessary step, but an optional one.

Referring to FIG. 4D, a conductive electrode layer is formed over the entire substrate 10. Next, the fourth mask M4 of the present invention is employed mainly to define the pixel electrode. After patterning the conductive electrode layer with the mask M4, for example, photoresist coating, exposing, developing, and etching, a pixel electrode layer 40 is formed. The pixel electrode layer 40 is electrically connected to the drain regions 30a, 34a of the TFT. The pixel electrode layer 40 can be an ordinary metal electrode, a transparent electrode such as ITO, or the like.

As described above, the present invention uses only four masks to make the TFT array structure as shown in FIG. 3. The present invention is not necessary to employ the conventional five masks, or to employ a half tone or gray tone mask such that total cost of the masks can be greatly reduced.

From the above description with reference to FIGS. 4A to 4D, a large part of the TFT array structure, especially the arrangement of the data line and pixel electrode in the TFT array, can be seen. FIG. 5 shows the structure of the gate line wiring area. The cross-sectional structure as shown on the left of FIG. 5 corresponds to the pattern G of the mask M1 in FIG. 4A. The gate line wiring area is also simultaneously fabricated by using the foregoing four masks M1 to M4. Next, the fabrication of the gate line wiring area is illustrated with reference to FIGS. 4A to 4D and 5. FIG. 5 shows the cross-sectional view of the gate line wiring area, gate area, and source/drain region. The steps for forming the gate line wiring area in FIGS. 4A to 4D can be clearly seen in FIG. 5.

As shown in FIGS. 5 and 4A, the mask pattern at the right of FIG. 4A shows two rows of the TFT arrays. In an ordinary TFT array, the gates of the transistors in the same row are connected together to form a so-called gate line or scanning line, while the gate lines of the transistors in each row are connected to a gate driver via the gate line wiring area. The mask M1 in FIG. 4A is used to define the position of the gate of the TFT and also to define the position of the gate line wiring area at the same time. The gate line wiring area and the gate in FIG. 4A substantially have the same structure, and each of them comprises a gate electrode layer 12, a gate insulating layer 14 and a silicon layer 16. Then, the mask M2 as shown in FIG. 4B is used to pattern the subsequently formed passivation layer 20, and the mask M3 as shown in FIG. 4C is used to pattern the subsequently formed $N^+$ ion implanting layer 30 and the metal layer 34. The metal layer 34c of the gate line wiring area G and the metal layer 34b used as the data line are separated, which is achieved by the mask M3.

Figure 4E:
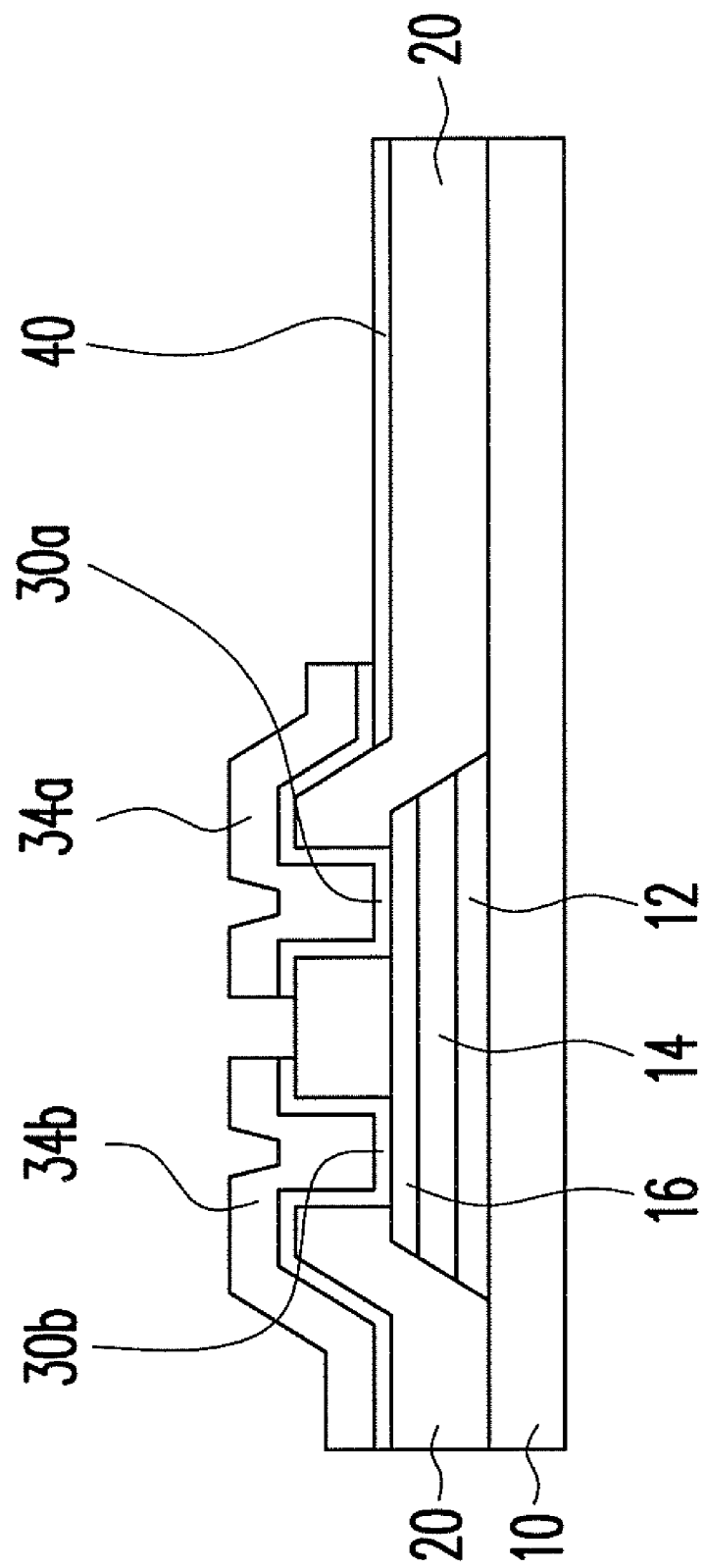
FIG. 4E is a view of an alternative embodiment of the first embodiment.

Moreover, the sequence of the fabrication as shown in FIGS. 4A to 4D is not fixed, and can be appropriately adjusted according to the practical situation. For example, the step of etching the exposed silicon layer can be implemented after the data line, data line wiring area, source/drain region, and a second layer of the gate line wiring area are formed (the third mask M3) or after the pixel electrode is formed (the fourth mask M4). In addition, as shown in FIG. 4E, the step of patterning the pixel electrode using the mask M4 can be implemented after passivation layer is formed and before passivation layer is patterned using the mask M2 or before the $N^+$ ion implanting layer 30 and the metal layer 34 are formed and patterned using the mask M3. In other words, the present invention is flexible in the processing sequence.

The Second Embodiment

Figure 6:
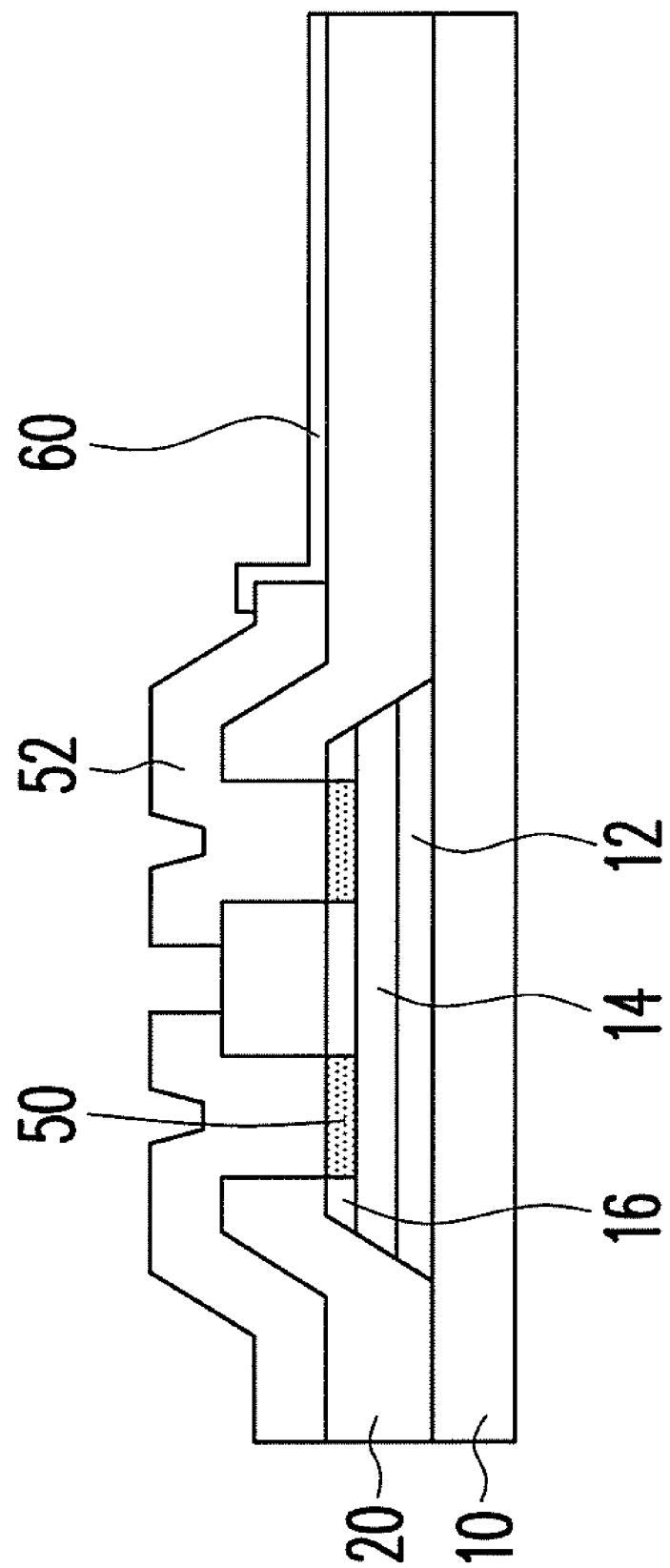
FIG. 6 is a cross-sectional view of the TFT array fabricated using the fabricating method according to the second embodiment of the invention.
Figure 7A:
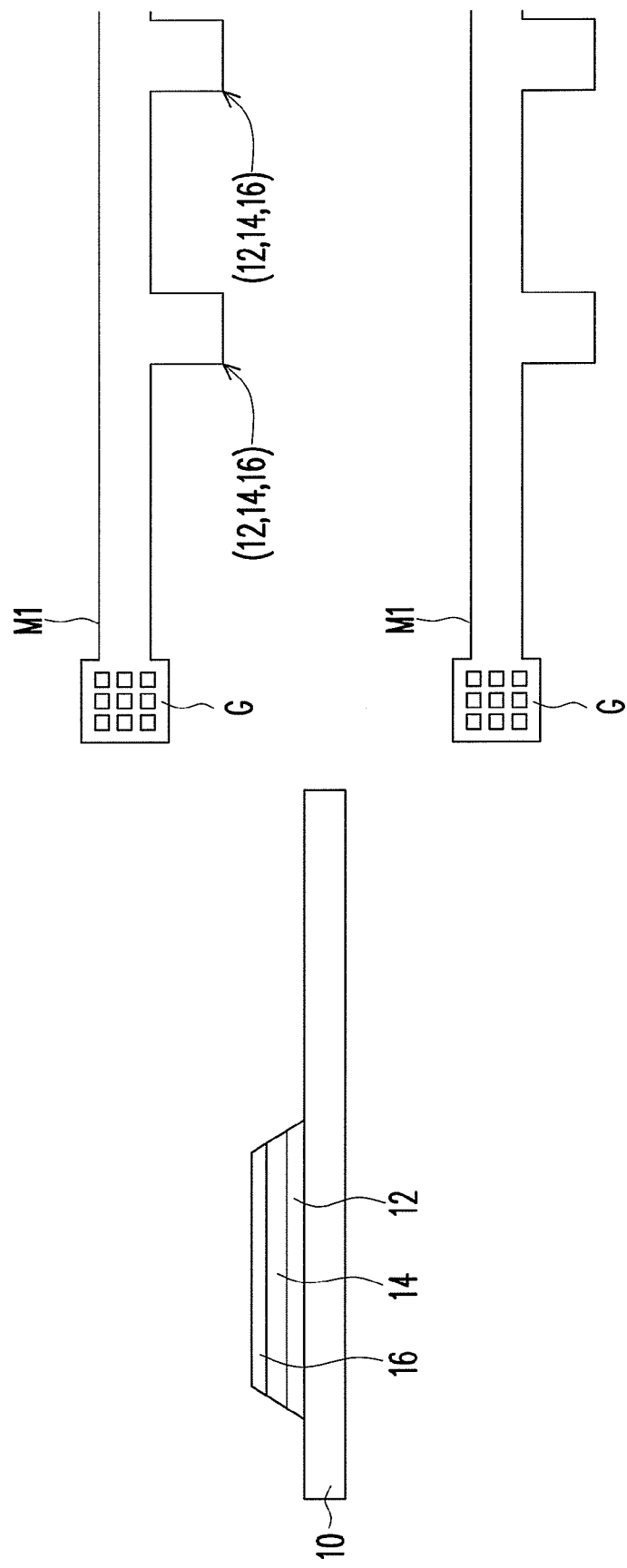
FIGS. 7A to 7D are views illustrating the process steps of the fabricating a TFT array according to the second embodiment, in which the cross-sectional views shown on the left of each figure indicate the fabrication step, and the schematic views shown on the right of each figure indicate the array layout employed in the fabrication method.
Figure 7B:
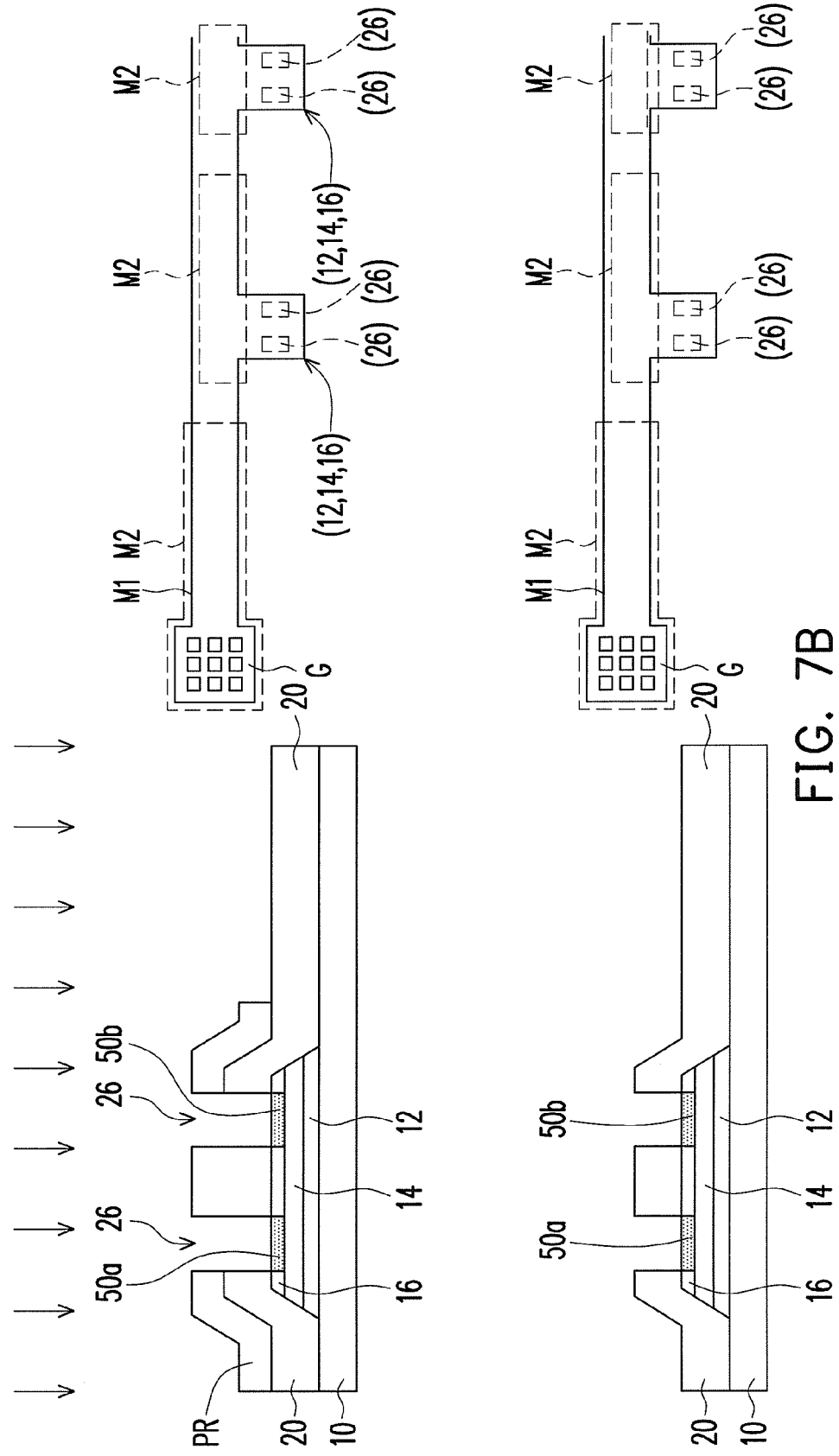
Figure 7C:
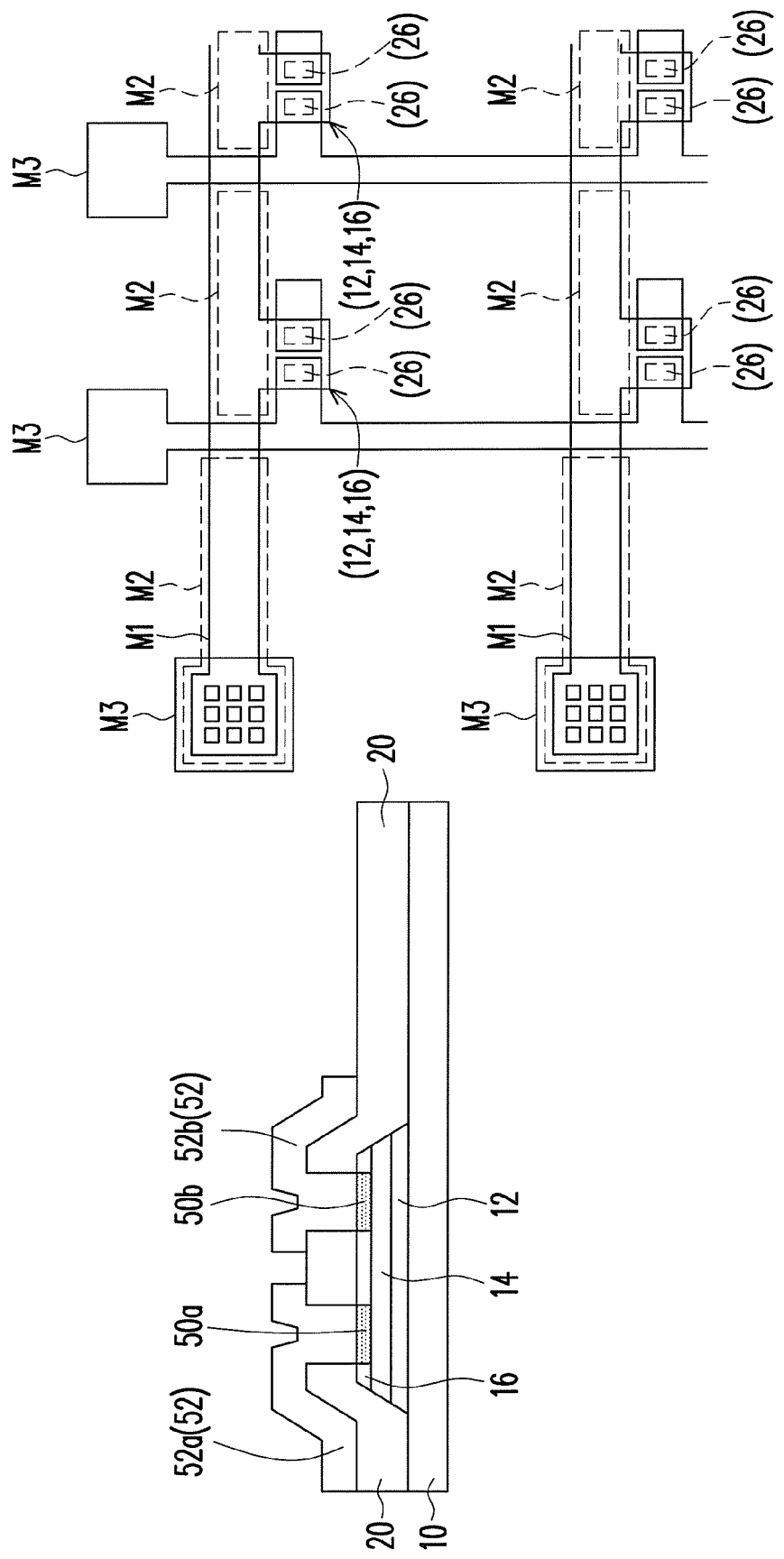
Figure 7D:
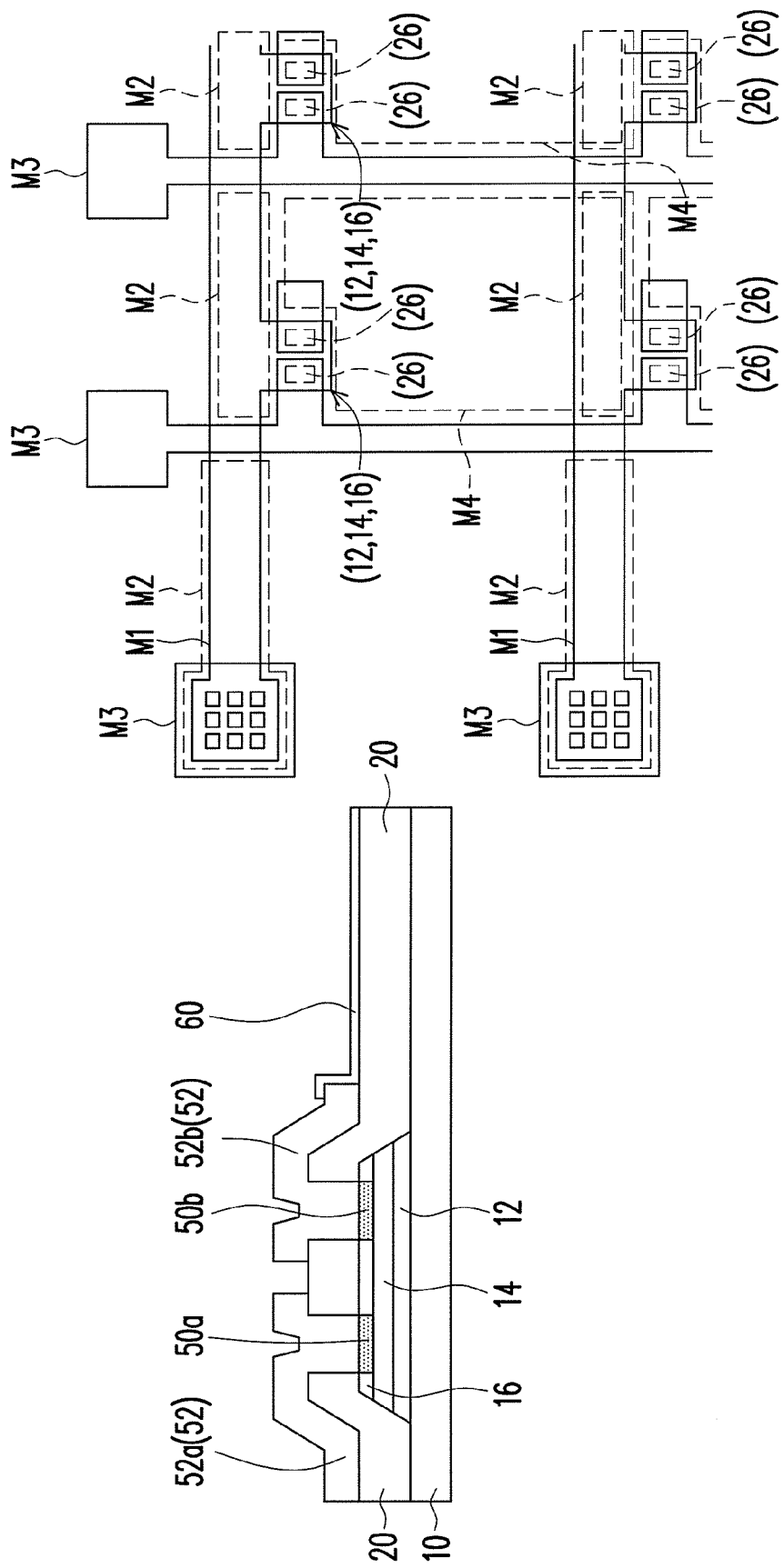
Figure 8:
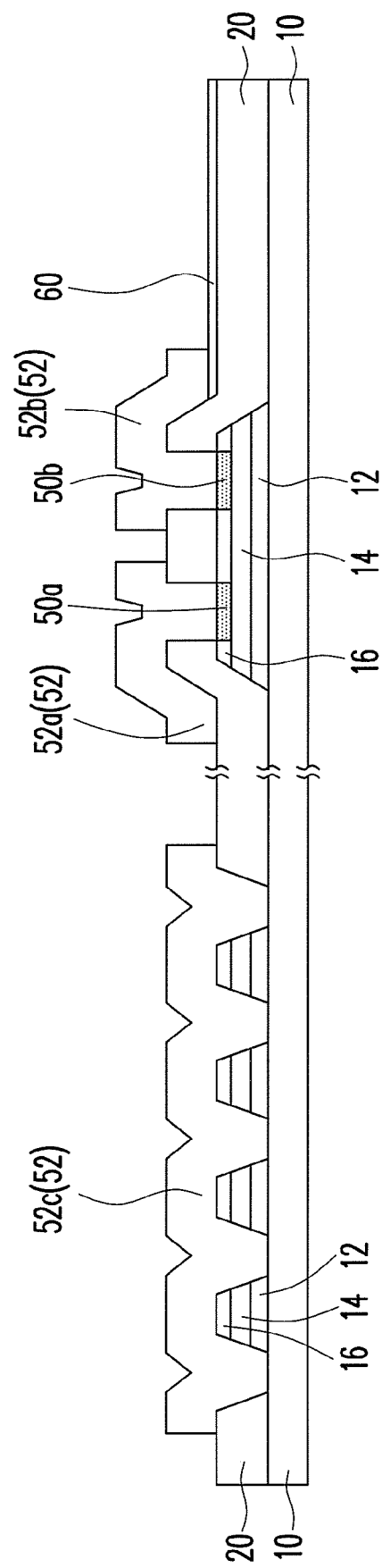
FIG. 8 is a schematic cross-sectional view of the gate line wiring area of the TFT array in FIG. 6.

FIG. 6, FIGS. 7A to 7D, and FIG. 8 illustrate the fabrication of a TFT array according to the second embodiment of the present invention. FIG. 6 is a cross-sectional view of the TFT fabricated using the method according to the second embodiment of the present invention. FIGS. 7A to 7D are schematic cross-sectional views illustrating the fabrication of the TFT array according to the second embodiment, wherein the cross-sectional views shown on the left of each figure indicate the fabrication step, while the schematic views shown on the right indicate the design of the TFT array. The left of FIG. 8 shows the schematic cross-sectional view of the gate pad or gate line wiring area of the TFT in FIG. 6.

As shown in FIG. 6, it is a variation embodiment of the first embodiment, and the difference between two embodiments is that the method for fabricating the source/drain. In the first embodiment, the method for fabricating the source/drain is the ion implanting layer is directly formed on the silicon layer. However, in the second embodiment, no additional ion implanting layer is formed. FIGS. 7A to 7D illustrate the process steps of fabricating the TFT array according to the second embodiment of the invention.

The process step shown in FIG. 7A is the same as that in FIG. 4A. That is, a substrate 10 having a gate electrode layer 12, a gate insulating layer 14, and a silicon layer 16 formed thereon is provided. Then, the gate electrode layer 12, the gate insulating layer 14, and the silicon layer 16 are patterned using the mask M1 to form across-sectional profile as shown on the left of FIG. 7A. The mask M1 is mainly used to define gate areas (12, 14, 16), a gate line, and a gate line wiring area G. The step is the same as that of the first embodiment, and therefore is not further described here.

Referring to FIG. 7B, a passivation layer 20 and a photoresist PR are formed over the entire substrate 10. The passivation layer 20 can be formed by any suitable, for example but not limited to, semiconductor process, such as a deposition process or a coating process. Next, the second mask M2 is employed to pattern the passivation layer 20 and the photoresist PR including the steps of such as coating the photoresist, exposing the photoresist, developing the photoresist, and removing the photoresist, to form contact holes 26 in the passivation layer 20 and the photoresist PR above the silicon layer 16 at the gate area, and a portion of the passivation layer above the gate line and the passivation layer 20 at the gate line wiring area G are removed. The contact holes 26 expose the silicon layer 16 underneath.

Next, the exposed silicon layer 16 is subjected to an ion implantation process using the photoresist PR as a mask. In the embodiment, $N^+$ ions may be implanted into the exposed silicon layer 16 to form the source/drain 50a, 50b of the TFT. The photoresist PR is then removed. Moreover, when the above silicon layer 16 is a poly-silicon layer, a P-type or N-type ion implantation can be implemented. When the above silicon layer 16 is an amorphous silicon layer, an N-type ion implantation is implemented.

As shown in FIG. 7C, a metal layer 52 is formed above the passivation layer 20. The metal layer 52 is further electrically connected to the source/drain 50a, 50b underneath via the contact holes 26. Then, the third mask M3 of the invention is used to define a data line, a data line wiring area, a source/drain region, and a second layer of the gate line wiring area.

After patterning using the mask M3, for example, performing steps of such as exposing, developing, and etching, the source regions (50a, 52a), drain regions (50b, 52b) as shown on the left of FIG. 7C are defined. That is, the metal layer 52a as shown on the left of FIG. 7C can be used as the data line of the TFT array and is electrically connected to the source 50a of the TFT. Same as the first embodiment, at this time, a step of removing the exposed silicon layer can be added according to requirements. The step is not a necessary step, but an optional one.

Referring to FIG. 7D, a conductive electrode layer is formed above the entire substrate 10. Next, the fourth mask M4 of the present invention is mainly used to define a pixel electrode. After patterning using the mask M4, such as performing steps of exposing, developing, and etching, a pixel electrode layer 60 is formed. The pixel electrode layer 60 is electrically connected to the drain regions 50b, 52b of the TFT. The pixel electrode layer 60 can be an ordinary metal electrode, a transparent electrode such as ITO, or the like.

As described above, patterning the TFT array structure in FIG. 6 can be achieved by using only four masks in the present invention. The present invention does not use the conventional five masks or use a half tone or gray tone mask. Therefore, total mask cost can be significantly reduced. Moreover, the second embodiment adopts a simple ion implantation method. Therefore, it is not necessary to use a special high-temperature plasma diffusing method for diffusing phosphor to form an $N^+$ implanting layer as shown in FIGS. 2A to 2D. In addition, compared with U.S. Pat. No. 6,891,196, a process of forming an insulating layer can be omitted, and thus the cost can be further reduced.

Likewise, FIG. 8 simply illustrates the fabrication process of the gate line wiring area according to the second embodiment of the invention. The fabrication flow of the gate line wiring area is substantially identical to that of the first embodiment, i.e., using masks M1 to M3. The difference between the two embodiments is that the gate line does not have the $N^+$ implanting layer in the second embodiment, and the metal layer 52 directly covers the stacked layer constituted by the gate electrode layer 12, gate insulating layer 14, and silicon layer 16. After patterning into a metal layer 52c using the mask M3, the metal layer 52c is used as a wire for connecting the gates of the transistors in the same row.

Figure 7E:
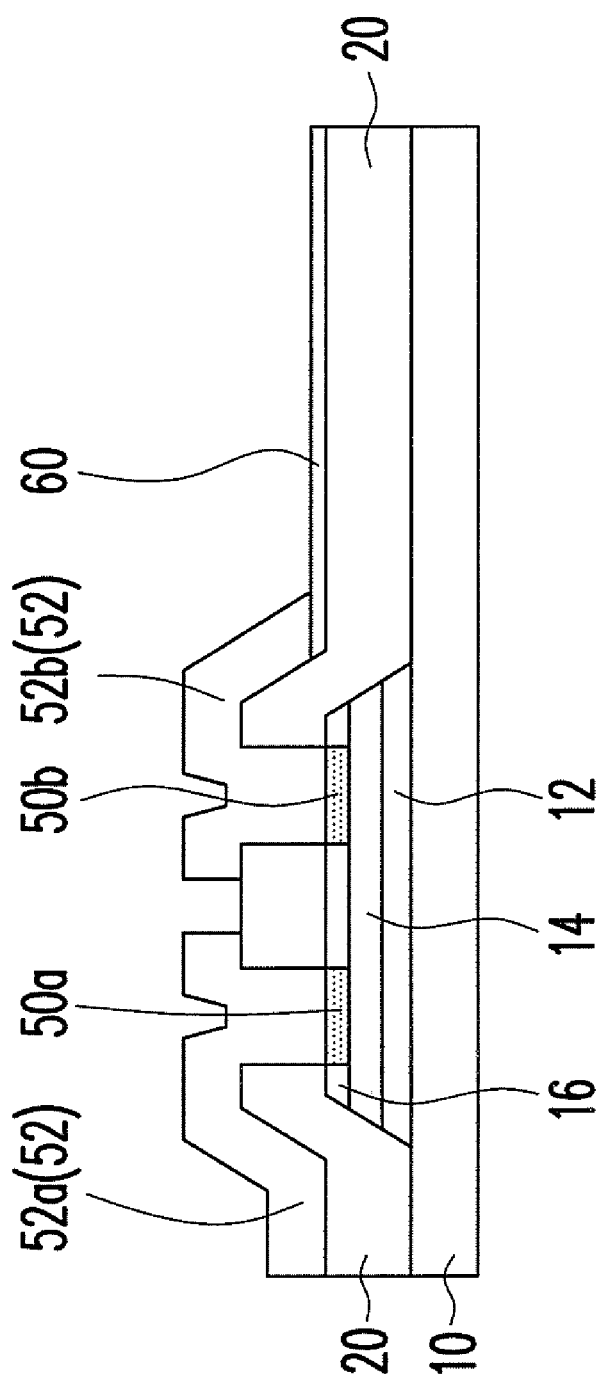
FIG. 7E is an alternative embodiment of the second embodiment.

Like the first embodiment, the sequence of the above-mentioned fabrication as shown in FIGS. 7A to 7D is not fixed, and can be appropriately adjusted according to the practical situation. For example, the foregoing step of etching the exposed silicon layer can be performed after the data line, data line wiring area, source/drain region, and a second layer of the gate line wiring area are formed (the third mask M3) or after the pixel electrode is formed (the fourth mask M4). In addition, as shown in FIG. 7E, step of patterning the pixel electrode by using the mask M4 can be performed after passivation layer is formed and before passivation layer is patterned using the mask M2 or before forming the metal layer 52 can be carried out and the mask M3 is used for patterning. In other words, the fabrication method of the present invention is flexible.

In view of the above description, the invention employs four masks M1 to M4 to fabricate a TFT array. The mask M1 is used to define the gate area, the gate line and the gate line wiring area. The mask M2 is used to define openings in the passivation layer to form the contact holes of the source and drain, and to remove partial area of the passivation layer on the gate line and the passivation layer on the gate line wiring area. The mask M3 is used to define a data line, a data line wiring area, a source/drain region and a second layer of the gate line wiring area. The fourth mask M4 is used to define a pixel electrode.

In summary, the present invention provides a new TFT array structure. Since a mask is used to simultaneously pattern the gate electrode layer, the gate insulating layer and the silicon layer to define the gate area, the gate line and the gate line wiring area. And the data line, drain metal layer and source metal layer are disposed above the passivation layer, so the total number of masks can be reduced to four. Moreover, since a simple ion implantation process is employed instead of a special plasma diffusing process, the fabrication cost can be further reduced. Besides, the sequence of the process steps can be flexibly altered.

Though the present invention has been disclosed above by the above embodiments, these are not intended to limit the invention. Anybody skilled in the art can make some modifications and variations without departing from the spirit and scope of the invention. Therefore, the protecting range of the invention falls in the appended claims.

What is claimed is:

1. A TFT array structure, comprising:
    a substrate, divided into a gate line wiring area and a gate area;
    a stacked structure, disposed on the gate area and the gate line wiring area of the substrate, wherein the stacked structure comprises a gate electrode layer, a gate insulating layer and a silicon layer;
    a passivation layer, covering the substrate and exposing the stacked structure of the gate line wiring area, wherein the passivation layer disposed on the stacked structure of the gate area further has at least two contact holes for exposing the silicon layer;
    an ion implanting layer, covering the passivation layer and the stacked structure corresponding to the gate area, and covering the stacked structure of the gate line wiring area, wherein the ion implanting layer is further connected to the silicon layer;
    a metal layer, covering the ion implanting layer, wherein the metal layer disposed in the gate line wiring area serves as a second layer of the gate line wiring area, and the metal layer disposed in the gate area is respectively serves as a source and a drain; and
    a pixel electrode layer, covering the passivation layer and connected to the metal layer serving as the drain and the ion implanting layer, wherein the ion implanting layer and the metal layer are disposed on the gate line wiring area covering the stacked structure, and the ion implanting layer and the metal layer are electrically connected to the gate electrode layer of the stacked structure through side walls of the gate electrode layer.

2. The TFT array structure according to claim 1, wherein when the silicon layer is a poly-silicon layer, the ion implanting layer is a P-type or N-type ion implanting layer.

3. The TFT array structure according to claim 1, wherein when the silicon layer is an amorphous silicon layer, the ion implanting layer is an N-type ion implanting layer.

4. The TFT array structure according to claim 1, wherein the pixel electrode is a transparent electrode or a metal electrode.

5. A TFT array structure, comprising:
    a substrate, divided into a gate line wiring area and a gate area;
    a stacked structure, disposed on the gate area and the gate line wiring area of the substrate, wherein the stacked structure comprises a gate electrode layer, a gate insulating layer and a silicon layer;
    a passivation layer, covering the substrate and exposing the stacked structure of the gate line wiring area, wherein the passivation layer disposed on the stacked structure of the gate area further has at least two contact holes for exposing the silicon layer, and the exposed silicon layer is further subject to an ion implantation;
    a metal layer, covering the exposed silicon layer, wherein the metal layer disposed on the gate line wiring area serves as a second layer of the gate line wiring area, and the metal layer disposed on the gate area is respectively serves as a source and a drain; and
    a pixel electrode layer, covering the passivation layer and connected to the metal layer serving as the drain, wherein the metal layer is disposed on the gate line wiring area covering the stacked structure, and the metal layer is electrically connected to the gate electrode layer of the stacked structure through side walls of the gate electrode layer.

6. The TFT array structure according to claim 5, wherein when the silicon layer is a poly-silicon layer, the ion implanting layer is a P-type or N-type ion implanting layer.

7. The TFT array structure according to claim 5, wherein when the silicon layer is an amorphous silicon layer, the ion implanting layer is an N-type ion implanting layer.

8. The TFT array structure according to claim 5, wherein the pixel electrode is a transparent electrode or a metal electrode.

* * * * *